US010283526B2

(12) United States Patent
Zhu et al.

(10) Patent No.: US 10,283,526 B2
(45) Date of Patent: May 7, 2019

(54) STANDARD CELL CIRCUITS EMPLOYING VOLTAGE RAILS ELECTRICALLY COUPLED TO METAL SHUNTS FOR REDUCING OR AVOIDING INCREASES IN VOLTAGE DROP

(71) Applicant: QUALCOMM Incorporated, San Diego, CA (US)

(72) Inventors: John Jianhong Zhu, San Diego, CA (US); Jeffrey Junhao Xu, San Diego, CA (US); Mustafa Badaroglu, Kessel-Lo (BE)

(73) Assignee: QUALCOMM Incorporated, San Diego, CA (US)

(*) Notice: Subject to any disclaimer, the term of this patent is extended or adjusted under 35 U.S.C. 154(b) by 103 days.

(21) Appl. No.: 15/386,501

(22) Filed: Dec. 21, 2016

(65) Prior Publication Data
US 2018/0175060 A1 Jun. 21, 2018

(51) Int. Cl.
H01L 27/10 (2006.01)
H01L 27/118 (2006.01)
H01L 21/8234 (2006.01)
H01L 23/50 (2006.01)
H01L 23/538 (2006.01)
(Continued)

(52) U.S. Cl.
CPC ......... H01L 27/11807 (2013.01); H01L 21/823475 (2013.01); H01L 23/50 (2013.01); H01L 23/5286 (2013.01); H01L 23/5386 (2013.01); H01L 27/0207 (2013.01); H01L 2027/11875 (2013.01); H01L 2027/11881 (2013.01)

(58) Field of Classification Search
None
See application file for complete search history.

(56) References Cited

U.S. PATENT DOCUMENTS 5,723,883 A 3/1998 Gheewalla
5,780,883 A * 7/1998 Tran ................. H01L 27/11807
257/204
7,446,352 B2 11/2008 Becker et al.
(Continued)

OTHER PUBLICATIONS

Invitation to Pay Additional Fees and Partial International Search Report for PCT/US2017/067306, dated Apr. 23, 2018, 13 pages.
(Continued)

Primary Examiner — Kevin M Picardat
(74) Attorney, Agent, or Firm — W&T/Qualcomm

(57) ABSTRACT

Standard cell circuits employing voltage rails electrically coupled to metal shunts for reducing or avoiding increases in voltage drop are disclosed. In one aspect, a standard cell circuit is provided that employs active devices that include corresponding gates disposed with a gate pitch. First and second voltage rails having a line width are disposed in a first metal layer. Employing the first and second voltage rails having substantially a same line width reduces the height of the standard cell circuit as compared to conventional standard cell circuits. Metal lines are disposed in a second metal layer with a metal pitch less than the gate pitch such that the number of metal lines exceeds the number of gates. Electrically coupling the first and second voltage rails to the metal shunts increases the conductive area of each voltage rail, which reduces a voltage drop across each voltage rail.

26 Claims, 7 Drawing Sheets

(51) Int. Cl.
*H01L 23/528* (2006.01)
*H01L 27/02* (2006.01)

(56) References Cited

U.S. PATENT DOCUMENTS

| | | | | |
|---|---|---|---|---|
| 7,923,757 | B2* | 4/2011 | Becker | H01L 27/0207 |
| | | | | 257/206 |
| 8,863,063 | B2* | 10/2014 | Becker | H01L 27/092 |
| | | | | 716/118 |
| 9,035,679 | B2 | 5/2015 | Yuan et al. | |
| 9,361,418 | B2 | 6/2016 | Moroz et al. | |
| 9,633,987 | B2* | 4/2017 | Smayling | H01L 27/0207 |
| 9,653,413 | B2* | 5/2017 | Frederick, Jr. | H01L 23/58 |
| 2005/0161706 | A1* | 7/2005 | Sutardja | H01L 23/4824 |
| | | | | 257/211 |
| 2012/0249182 | A1* | 10/2012 | Sherlekar | G06F 17/5077 |
| | | | | 326/101 |
| 2012/0280287 | A1* | 11/2012 | Hou | H01L 27/0207 |
| | | | | 257/288 |
| 2015/0333008 | A1* | 11/2015 | Gupta | H01L 27/0207 |
| | | | | 257/369 |
| 2015/0347659 | A1 | 12/2015 | Chiang et al. | |
| 2017/0194329 | A1* | 7/2017 | Iwahori | H01L 27/1104 |
| 2017/0345809 | A1* | 11/2017 | Chang | H01L 27/0207 |
| 2018/0122824 | A1* | 5/2018 | Gupta | H01L 27/092 |

OTHER PUBLICATIONS

International Search Report and Written Opinion for PCT/US2017/067306, dated Jun. 13, 2018, 19 pages.

\* cited by examiner

STANDARD CELL CIRCUITS EMPLOYING VOLTAGE RAILS ELECTRICALLY COUPLED TO METAL SHUNTS FOR REDUCING OR AVOIDING INCREASES IN VOLTAGE DROP

BACKGROUND

I. Field of the Disclosure

The technology of the disclosure relates generally to standard cell circuits, and particularly to avoiding or reducing increases in voltage drop in standard cell circuits.

II. Background

Processor-based computer systems can include a vast array of integrated circuits (ICs). Each IC has a complex layout design comprised of multiple IC devices. Standard cell circuits are often employed to assist in making the design of ICs less complex and more manageable. In particular, standard cell circuits provide a designer with pre-designed cells corresponding to commonly used IC devices that conform to specific design rules of a chosen technology. As non-limiting examples, standard cell circuits may include gates, inverters, multiplexers, and adders. Using standard cell circuits enables a designer to create ICs having consistent layout designs, thereby creating a more uniform and less complex layout design across multiple ICs, as compared to custom-designing each circuit.

Conventional standard cell circuits are fabricated using process technologies that form device elements with a pre-defined technology node size. For example, a process technology may be employed to fabricate a conventional standard cell circuit with device elements fourteen (14) nanometers (nm) or ten (10) nm wide. Improvements in fabrication processes and related technologies are enabling decreases in technology node size, which allows a higher number of device elements, such as transistors, to be disposed in less area within a circuit. As technology node size scales down, gate and metal lines within a conventional standard cell circuit also scale down to reduce the area of a conventional standard cell circuit. For example, gate length can scale down to reduce the width of a conventional standard cell circuit, and metal line width can scale down to reduce the height.

However, as the technology node size scales down to ten (10) nm and below for example, the width of a conventional standard cell circuit cannot continue to scale down due to gate pitch limitations. In particular, even as technology node size decreases, minimum gate length requirements for devices within a conventional standard cell circuit limit how small the gate pitch, and thus the width of the conventional standard cell circuit, may be reduced. Additionally, reducing the height of a conventional standard cell circuit may face limitations due to voltage requirements. For example, voltage rails employed in a conventional standard cell circuit and configured to receive voltage, such as supply voltage, can be scaled down to reduce the height of the conventional standard cell circuit. However, scaling down voltage rails increases rail resistances, thus increasing a voltage drop (i.e., current-resistance (IR) drop) across the voltage rails. Increased voltage drop reduces the voltage available from the voltage rails for devices in a conventional standard cell circuit, which may cause erroneous operation of the devices. Therefore, it would be advantageous to scale down the area of a standard cell circuit while reducing or avoiding increases in corresponding voltage drop.

SUMMARY OF THE DISCLOSURE

Aspects disclosed herein include standard cell circuits employing voltage rails electrically coupled to metal shunts for reducing or avoiding increases in voltage drop. In particular, standard cell circuits described herein include metal lines disposed with a metal pitch, such that the number of metal lines allows some metal lines to be dedicated to electrically coupling voltage rails to metal shunts to increase the conductive area of the voltage rails. The increased conductive area reduces the resistance of the voltage rails, which reduces the voltage drop across the voltage rails. In this manner, the voltage rails can have a relatively smaller width while reducing or avoiding increases in voltage drop across the voltage rails. In one exemplary aspect, a standard cell circuit is provided in a circuit layout that employs active devices that include corresponding gates disposed with a gate pitch. A first voltage rail having a line width is disposed in a first metal layer, and a second voltage rail having substantially the same line width as the first voltage rail is disposed in the first metal layer. Employing the first and second voltage rails having substantially the same line width reduces the height of the standard cell circuit compared to conventional standard cell circuits. Metal lines are disposed in a second metal layer with a metal pitch less than the gate pitch, such that the number of metal lines exceeds the number of gates. In this manner, additional metal lines can be provided that can be dedicated to coupling the voltage rails to metal shunts disposed in a third metal layer to reduce the resistance of the narrower width voltage rails, while other metal lines can be dedicated to interconnecting the gates of the active devices. Electrically coupling the first and second voltage rails to the metal shunts increases the conductive area of each voltage rail, which reduces a corresponding resistance. The reduced resistance corresponds to a reduced voltage drop (i.e., current-resistance (IR) drop) across each voltage rail. Thus, the standard cell circuit achieves a reduced area compared to conventional standard cell circuits by way of the narrower voltage rails, while also reducing or avoiding increases in voltage drop corresponding to the narrower voltage rails.

In this regard in one aspect, a standard cell circuit is provided. The standard cell circuit comprises a plurality of active devices comprising a plurality of corresponding gates disposed with a gate pitch. The standard cell circuit also comprises a first voltage rail having a line width disposed in a first metal layer and corresponding to a first one-half track. The first voltage rail is configured to receive a first voltage. The standard cell circuit also comprises a second voltage rail having the line width disposed in the first metal layer and corresponding to a second one-half track. The second voltage rail is configured to receive a second voltage. The standard cell circuit also comprises a plurality of metal lines disposed in a second metal layer with a metal pitch less than the gate pitch. One or more metal lines of the plurality of metal lines is electrically coupled to one or more gates of the plurality of gates. The standard cell circuit also comprises a first metal shunt disposed in a third metal layer and is electrically coupled to the first voltage rail using one or more metal lines of the plurality of metal lines not electrically coupled to the one or more gates. The standard cell circuit also comprises a second metal shunt disposed in the third metal layer and is electrically coupled to the second voltage rail using one or more metal lines of the plurality of metal lines not electrically coupled to the one or more gates.

In another aspect, a standard cell circuit is provided. The standard cell circuit comprises a means for performing a logic function comprising a means for receiving a gate voltage disposed with a gate pitch. The standard cell circuit also comprises a means for providing a first voltage disposed in a first metal layer having a line width and corresponding to a first one-half track. The standard cell circuit also comprises a means for providing a second voltage disposed in the first metal layer having the line width and corresponding to a second one-half track. The standard cell circuit also comprises a plurality of means for electrically coupling disposed in a second metal layer with a metal pitch less than the gate pitch. One or more means for electrically coupling is electrically coupled to the means for receiving the gate voltage. The standard cell circuit also comprises a means for increasing a first resistance disposed in a third metal layer electrically coupled to the means for providing the first voltage and one or more means for electrically coupling not electrically coupled to the means for receiving the gate voltage. The standard cell circuit also comprises a means for increasing a second resistance disposed in the third metal layer electrically coupled to the means for providing the second voltage and one or more means for electrically coupling not electrically coupled to the means for receiving the gate voltage.

In another aspect, a method of manufacturing a standard cell circuit employing voltage rails electrically coupled to metal shunts for reducing or avoiding increases in voltage drop is provided. The method comprises disposing a plurality of gates with a gate pitch. Each gate of the plurality of gates corresponds to an active device of a plurality of active devices. The method also comprises disposing a first voltage rail in a first metal layer and corresponding to a first one-half track, wherein the first voltage rail has a line width and is configured to receive a first voltage. The method also comprises disposing a second voltage rail in the first metal layer and corresponding to a second one-half track, wherein the second voltage rail has the line width and is configured to receive a second voltage. The method also comprises disposing a plurality of metal lines in a second metal layer and having a metal pitch less than the gate pitch. One or more metal lines of the plurality of metal lines is electrically coupled to one or more gates of the plurality of gates. The method also comprises disposing a first metal shunt in a third metal layer, wherein the first metal shunt is electrically coupled to the first voltage rail and one or more metal lines of the plurality of metal lines not electrically coupled to the one or more gates. The method also comprises disposing a second metal shunt in the third metal layer, wherein the second metal shunt is electrically coupled to the second voltage rail and one or more metal lines of the plurality of metal lines not electrically coupled to the one or more gates.

DETAILED DESCRIPTION

Figure 1:
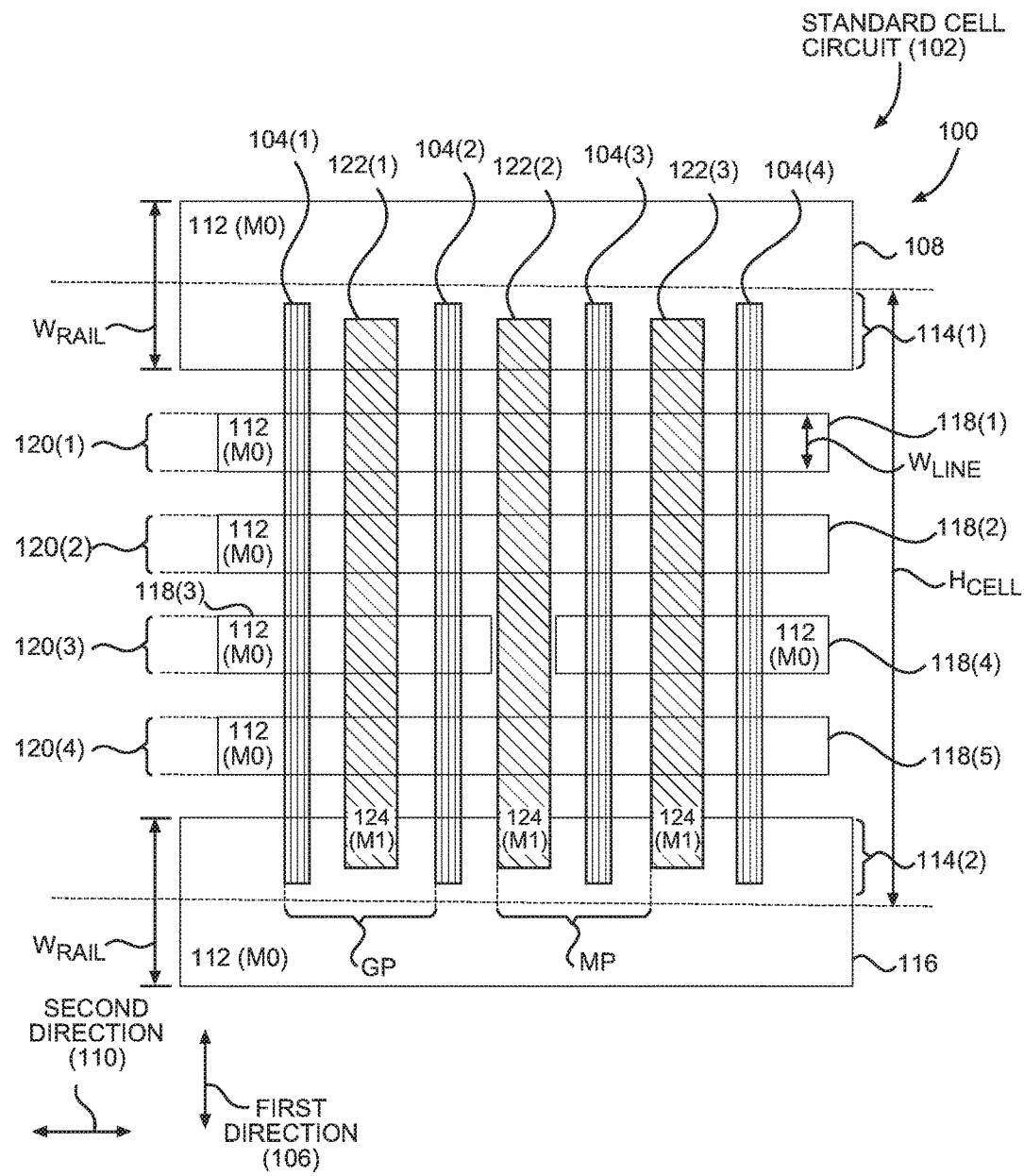
FIG. 1 is a top-view diagram of a conventional standard cell circuit employing first and second voltage rails having a width that is larger than a width of routing lines.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include standard cell circuits employing voltage rails electrically coupled to metal shunts for reducing or avoiding increases in voltage drop. In particular, standard cell circuits described herein include metal lines disposed with a metal pitch, such that the number of metal lines allows some metal lines to be dedicated to electrically coupling voltage rails to metal shunts to increase the conductive area of the voltage rails. The increased conductive area reduces the resistance of the voltage rails, which reduces the voltage drop across the voltage rails. In this manner, the voltage rails can have a relatively smaller width while reducing or avoiding increases in voltage drop across the voltage rails. In one exemplary aspect, a standard cell circuit is provided in a circuit layout that employs active devices that include corresponding gates disposed with a gate pitch. A first voltage rail having a line width is disposed in a first metal layer, and a second voltage rail having substantially the same line width as the first voltage rail is disposed in the first metal layer. Employing the first and second voltage rails having substantially the same line width reduces the height of the standard cell circuit compared to conventional standard cell circuits. Metal lines are disposed in a second metal layer with a metal pitch less than the gate pitch, such that the number of metal lines exceeds the number of gates. In this manner, additional metal lines can be provided that can be dedicated to coupling the voltage rails to metal shunts disposed in a third metal layer to reduce the resistance of the narrower width voltage rails, while other metal lines can be dedicated to interconnecting the gates of the active devices. Electrically coupling the first and second voltage rails to the metal shunts increases the conductive area of each voltage rail, which reduces a corresponding resistance. The reduced resistance corresponds to a reduced voltage drop (i.e., current-resistance (IR) drop) across each voltage rail. Thus, the standard cell circuit achieves a reduced area compared to conventional standard cell circuits by way of the narrower voltage rails, while also reducing or avoiding increases in voltage drop corresponding to the narrower voltage rails.

Figure 2A:
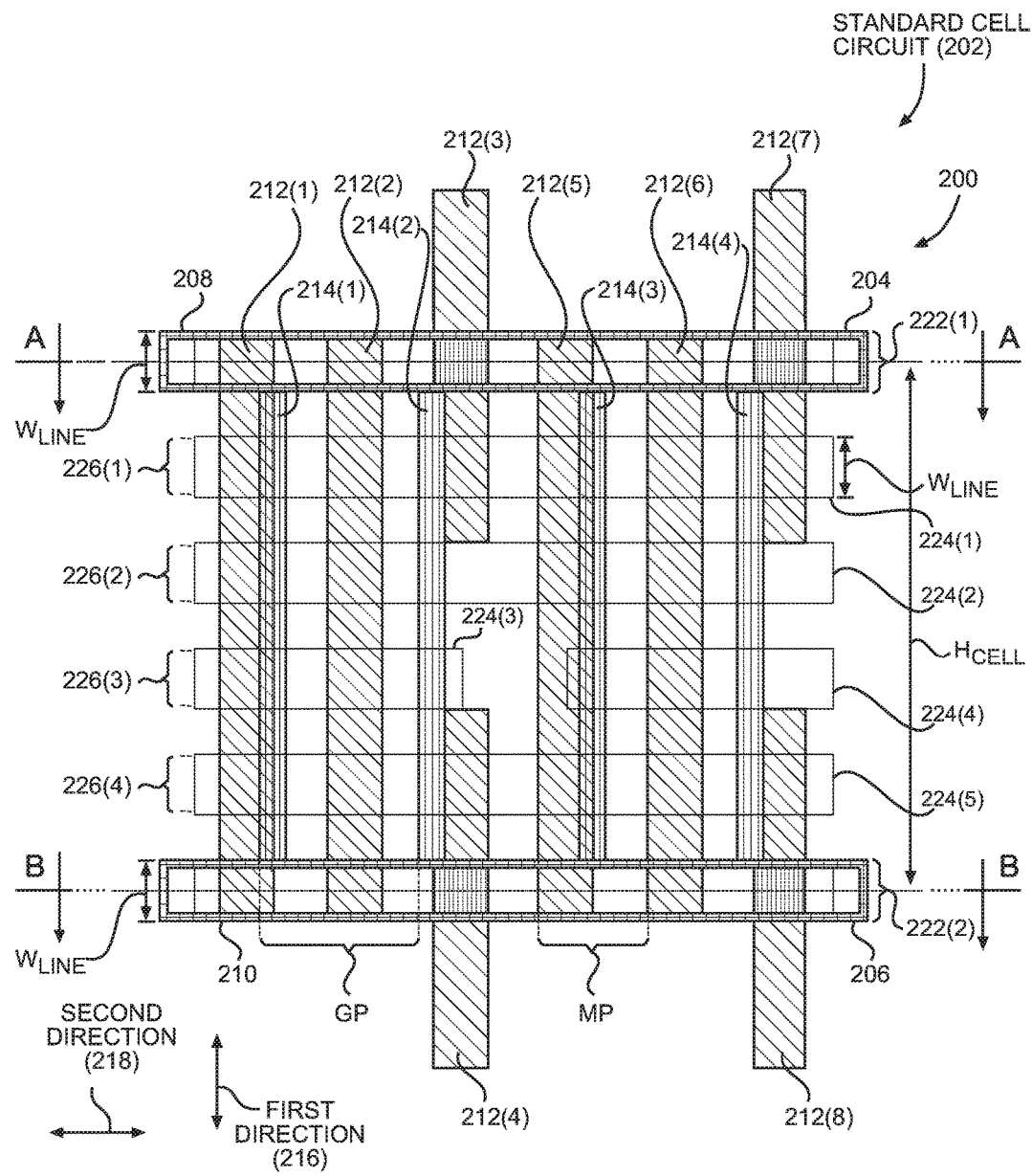
FIG. 2A is a top-view diagram of an exemplary standard cell circuit employing voltage rails electrically coupled to metal shunts by way of dedicated metal lines made available by employing a metal pitch that is less than a gate pitch, wherein the metal shunts reduce or avoid increases in voltage drop that would otherwise result from narrower voltage rails while allowing the standard cell circuit to achieve a reduced area.

Before discussing the details of standard cell circuits employing voltage rails electrically coupled to metal shunts for reducing or avoiding increases in voltage drop beginning in FIG. 2A, a conventional standard cell circuit is first described. In this regard, FIG. 1 illustrates a layout 100 of a conventional standard cell circuit 102. The standard cell circuit 102 employs active devices (not shown) that include corresponding gates 104(1)-104(4) disposed in a first direction 106 with a gate pitch GP. The standard cell circuit 102 includes a first voltage rail 108 disposed in a second direction 110 substantially orthogonal to the first direction 106 in a first metal layer 112 (e.g., a metal zero (M0) metal layer). The first voltage rail 108 has a rail width $W_{RAIL}$. The first voltage rail 108 corresponds to a first track 114(1) and is configured to receive a first voltage, such as a supply voltage. Additionally, the standard cell circuit 102 includes a second voltage rail 116 disposed in the second direction 110 in the first metal layer 112. The second voltage rail 116 has the rail width $W_{RAIL}$. The second voltage rail 116 corresponds to a second track 114(2) and is configured to receive a second voltage, such as a ground voltage. The first and second voltage rails 108, 116 have the rail width $W_{RAIL}$ such that the corresponding conductive area of each is large enough to achieve a relatively low resistance, and thus, a relatively low voltage drop across the first and second voltage rails 108, 116.

With continuing reference to FIG. 1, the standard cell circuit 102 also employs routing lines 118(1)-118(5) disposed in the second direction 110 in the first metal layer 112 between the first and second voltage rails 108, 116. The routing lines 118(1)-118(5) are used, in part, to interconnect elements in the standard cell circuit 102 to form various devices, such as particular logic gates. Each routing line 118(1)-118(5) corresponds to a routing track 120(1)-120(4), and has a line width $W_{LINE}$. To further assist in interconnecting elements in the standard cell circuit 102, as well as to interconnect elements to the first and second voltage rails 108, 116, metal lines 122(1)-122(3) are disposed substantially in the first direction 106 in a second metal layer 124 (e.g., a metal one (M1) metal layer) between the respective gates 104(1)-104(4). The metal lines 122(1)-122(3) have a metal pitch MP approximately equal to the gate pitch GP. In other words, a ratio of the metal pitch MP to the gate pitch GP is approximately equal to 1:1. The standard cell circuit 102 employs such a 1:1 ratio, in part, due to conventional fabrication techniques.

With continuing reference to FIG. 1, as the technology node size scales down to ten (10) nanometers (nm) and below, the percentage by which the layout 100 can scale down in the second direction 110 is limited due to gate pitch GP requirements. However, the layout 100 may scale down in area by reducing a total height $H_{CELL}$. For example, the total height $H_{CELL}$ of the layout 100 in the first direction 106 is measured from the center of the first voltage rail 108 to the center of the second voltage rail 116. Thus, to reduce the total height $H_{CELL}$, the first and second voltage rails 108, 116 can be employed having a width smaller than the rail width $W_{RAIL}$, such that each of the first and second voltage rails 108, 116 consumes a one-half track instead of the first and second tracks 114(1), 114(2). Reducing the width of the first and second voltage rails 108, 116 in this manner causes the standard cell circuit 102 to be referred to as a five (5) track cell (i.e., two (2) one-half tracks plus routing tracks 120(1)-120(4)) rather than a six (6) track cell (i.e., first and second tracks 114(1), 114(2) plus four (4) routing tracks 120(1)-120(4)) as illustrated in FIG. 1. However, reducing the rail width $W_{RAIL}$ decreases the conductive area of both the first and second voltage rails 108, 116. Such a reduction in the conductive area results in both the first and second voltage rails 108, 116 having an increased resistance, and thus an increased voltage drop (i.e., current-resistance (IR) drop). An increased voltage drop reduces the voltage distributed from the first and second voltage rails 108, 116 to corresponding devices, which may cause erroneous operation of devices in the standard cell circuit 102.

Figure 2B:
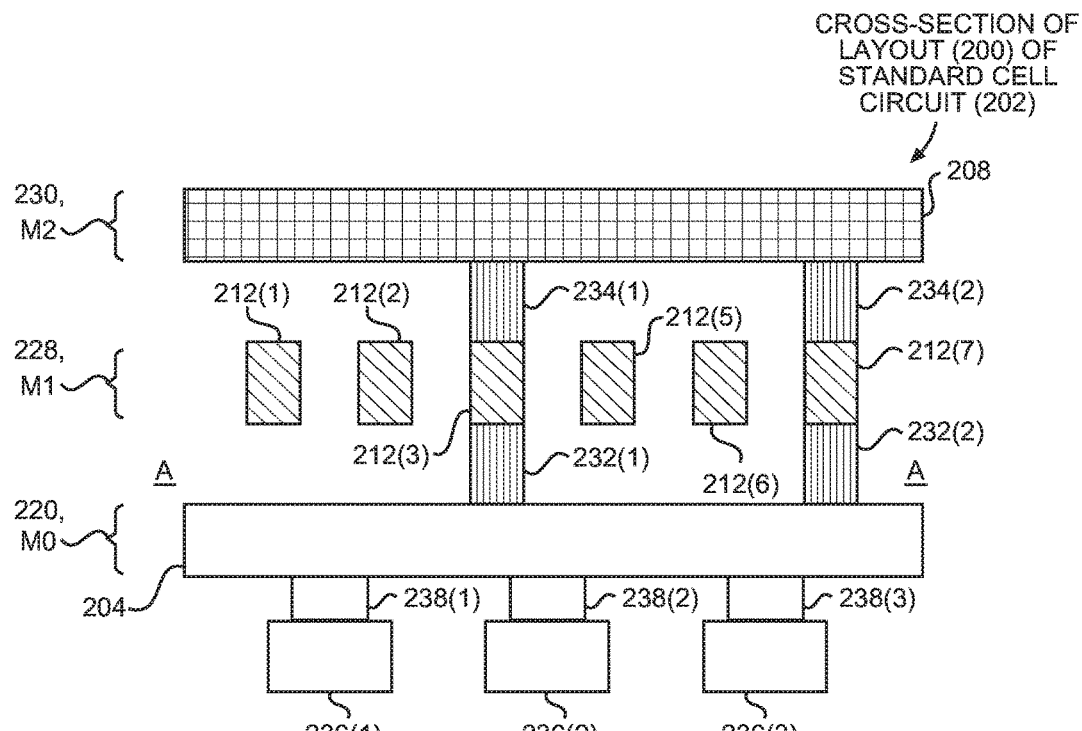
FIG. 2B illustrates a cross-sectional diagram of the standard cell circuit of FIG. 2A employing voltage rails electrically coupled to the metal shunts, taken generally along the line A-A of FIG. 2A.
Figure 2C:
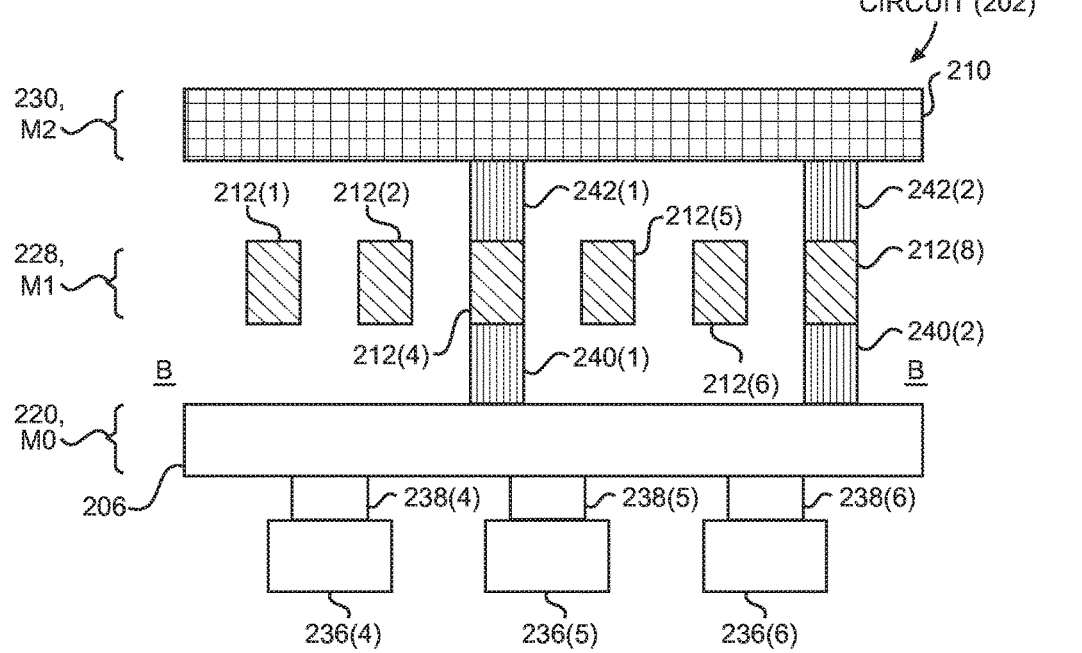
FIG. 2C illustrates a cross-sectional diagram of the standard cell circuit of FIG. 2A employing voltage rails electrically coupled to the metal shunts, taken generally along the line B-B of FIG. 2A.

In this regard, FIGS. 2A-2C illustrate an exemplary layout 200 of an exemplary standard cell circuit 202 employing first and second voltage rails 204, 206 electrically coupled to first and second metal shunts 208, 210 for reducing or avoiding increases in voltage drop while achieving a reduced area. As described in more detail below, the standard cell circuit 202 includes metal lines 212(1)-212(8) disposed with a metal pitch MP such that the number of metal lines 212(1)-212(8) allows additional metal lines 212(1)-212(8) to be dedicated to electrically coupling the first and second voltage rails 204, 206 to the respective first and second metal shunts 208, 210. Such coupling increases the conductive area of the first and second voltage rails 204, 206, which reduces the resistance and the voltage drop across the first and second voltage rails 204, 206. In this manner, the first and second voltage rails 204, 206 can have a relatively smaller width while reducing or avoiding increases in voltage drop across the first and second voltage rails 204, 206. FIG. 2A illustrates a top-view of the layout 200 of the standard cell circuit 202, while FIGS. 2B and 2C illustrate cross-sectional views of the layout 200 of the standard cell circuit 202. The cross-sectional diagram of FIG. 2B is taken generally along the line A-A of FIG. 2A, and the cross-sectional diagram of FIG. 2C is taken generally along the line B-B of FIG. 2A. Components of the layout 200 of the standard cell circuit 202 are referred to with common element numbers in FIGS. 2A-2C.

With reference to FIGS. 2A-2C, the standard cell circuit 202 includes active devices (not shown) that include corresponding gates 214(1)-214(4) disposed in a first direction 216 with a gate pitch GP. While this aspect includes the gates 214(1)-214(4), other aspects may employ any number M of gates 214. The standard cell circuit 202 also includes the first voltage rail 204 disposed in a second direction 218 substantially orthogonal to the first direction 216 in a first metal layer 220 (e.g., a metal zero (M0) metal layer). The first voltage rail 204 has a line width $W_{LINE}$. The first voltage rail 204 corresponds to a first one-half track 222(1) and is configured to receive a first voltage, such as a supply voltage. Additionally, the standard cell circuit 202 includes the second voltage rail 206 disposed in the second direction 218 in the first metal layer 220 (e.g., M0 metal layer). The second voltage rail 206 has the line width $W_{LINE}$. The second voltage rail 206 corresponds to a second one-half track 222(2) and is configured to receive a second voltage, such as a ground voltage.

With continuing reference to FIGS. 2A-2C, the standard cell circuit 202 also includes routing lines 224(1)-224(5) disposed in the second direction 218 substantially orthogonal to the first direction 216 in the first metal layer 220 (e.g., M0 metal layer) between the first and second voltage rails 204, 206. The routing lines 224(1)-224(5) are used, in part, to interconnect elements in the standard cell circuit 202 to form various devices, such as particular logic gates. Each routing line 224(1)-224(5) corresponds to a routing track 226(1)-226(4), and has the line width $W_{LINE}$. For example, the routing line 224(1) corresponds to the routing track 226(1), the routing line 224(2) corresponds to the routing track 226(2), the routing lines 224(3), 224(4) correspond to the routing track 226(3), and the routing line 224(5) corresponds to the routing track 226(4). As used herein, a track, such as a one-half track 222(1), 222(2) or a routing track 226(1)-226(4), is a defined area in the layout 200 in which a particular type of line, such as the first voltage rail 204 or routing line 224(1), may be disposed.

With continuing reference to FIGS. 2A-2C, to further assist in interconnecting elements in the standard cell circuit 202, as well as to interconnect elements to the first and second voltage rails 204, 206, the metal lines 212(1)-212(8) are disposed in the first direction 216 in a second metal layer 228 (e.g., a metal one (M1) metal layer). As described in more detail below, the metal lines 212(1)-212(8) have a metal pitch MP that is less than the gate pitch GP such that the number of metal lines 212(1)-212(8) exceeds the number of gates 214(1)-214(4). While this aspect includes the metal lines 212(1)-212(8), other aspects may employ any number N of metal lines 212.

With continuing reference to FIGS. 2A-2C, the first and second voltage rails 204, 206 having substantially the same line width $W_{LINE}$ as the routing lines 224(1)-224(5) results in the first and second voltage rails 204, 206 being narrower in line width $W_{LINE}$ than the rail width $W_{RAIL}$ of the first and second voltage rails 108, 116 in FIG. 1. In this manner, the layout 200 of the standard cell circuit 202 has a smaller cell height $H_{CELL}$ compared to the layout 100 of the standard cell circuit 102 in FIG. 1. However, the first and second voltage rails 204, 206 having the line width $W_{LINE}$ decreases the conductive area of the first and second voltage rails 204, 206, which increases their resistance. To reduce or avoid an increase in a voltage drop (i.e., current-resistance (IR) drop) attributable to such increased resistance, the standard cell circuit 202 includes the first and second metal shunts 208, 210 in a third metal layer 230 (e.g., a metal two (M2) metal layer) that are electrically coupled to the first and second voltage rails 204, 206, respectively. In particular, the first and second voltage rails 204, 206 are electrically coupled to the first and second metal shunts 208, 210, respectively, by way of a subset of the metal lines 212(1)-212(8) that are not electrically coupled to the gates 214(1)-214(4). The respective first and second metal shunts 208, 210 increase the conductive area of the first and second voltage rails 204, 206. Increasing the conductive area of the first and second voltage rails 204, 206 reduces their resistance, which reduces or avoids an increase in the voltage drop (i.e., IR drop) across the first and second voltage rails 204, 206.

As a non-limiting example, with continuing reference to FIGS. 2A-2C, the first metal shunt 208 is electrically coupled to the first voltage rail 204 using the metal lines 212(3), 212(7). More specifically, in this example, first vias 232(1), 232(2) are disposed between the first metal layer 220 (e.g., M0 metal layer) and the second metal layer 228 (e.g., M1 metal layer) such that the first vias 232(1), 232(2) electrically couple the metal lines 212(3), 212(7), respectively, to the first voltage rail 204. Further, first vias 234(1), 234(2) are disposed between the second metal layer 228 (e.g., M1 metal layer) and the third metal layer 230 (e.g., M2 metal layer) such that the first vias 234(1), 234(2) electrically couple the metal lines 212(3), 212(7) to the first metal shunt 208. Additionally, the first voltage rail 204 is electrically coupled to device layers 236(1)-236(3) of corresponding devices using contacts 238(1)-238(3), respectively. For example, the device layers 236(1)-236(3) may be sources of corresponding devices, wherein the contacts 238(1)-238(3) may be corresponding source contacts.

With continuing reference to FIGS. 2A-2C, the second metal shunt 210 is electrically coupled to the second voltage rail 206 using the metal lines 212(4), 212(8). More specifically, in this example, second vias 240(1), 240(2) are disposed between the first metal layer 220 (e.g., M0 metal layer) and the second metal layer 228 (e.g., M1 metal layer) such that the second vias 240(1), 240(2) electrically couple the metal lines 212(4), 212(8), respectively, to the second voltage rail 206. Further, second vias 242(1), 242(2) are disposed between the second metal layer 228 (e.g., M1 metal layer) and the third metal layer 230 (e.g., M2 metal layer) such that the second vias 242(1), 242(2) electrically couple the metal lines 212(4), 212(8) to the second metal shunt 210. Additionally, the second voltage rail 206 is electrically coupled to device layers 236(4)-236(6) of corresponding devices using contacts 238(4)-238(6), respectively. For example, the device layers 236(4)-236(6) may be sources of corresponding devices, wherein the contacts 238(4)-238(6) may be corresponding source contacts.

With continuing reference to FIGS. 2A-2C, to employ the first and second metal shunts 208, 210 as described above, the metal lines 212(3), 212(4), 212(7), and 212(8) are not used to electrically couple other elements in the standard cell circuit 202, such as the gates 214(1)-214(4) of the active devices. In other words, the metal lines 212(3), 212(4), 212(7), and 212(8) are dedicated to electrically coupling the first and second metal shunts 208, 210 to the first and second voltage rails 204, 206, respectively, and are not used to electrically couple other elements. In order to have enough metal lines 212(1)-212(8) to allow the metal lines 212(3), 212(4), 212(7), and 212(8) to be used in this manner, the metal lines 212(1)-212(8) have the metal pitch MP that is less than the gate pitch GP such that the number of metal lines 212(1)-212(8) exceeds the number of gates 214(1)-214(4). As a non-limiting example, the metal pitch MP in this aspect is equal or approximately equal to two-thirds (⅔) of the gate pitch GP (i.e., a ratio of the metal pitch MP to the gate pitch GP is approximately equal to 2:3). Thus, in this example, if the standard cell circuit 202 is fabricated using a process technology having a ten (10) nm technology node size, the metal pitch MP and the gate pitch GP may be equal or approximately equal to twenty-eight (28) nm and forty-two (42) nm, respectively. This configuration results in enough metal lines 212(1)-212(8) to allow the metal lines 212(3), 212(4), 212(7), and 212(8) to be dedicated to electrically coupling the first and second voltage rails 204, 206 to the first and second metal shunts 208, 210, respectively. Further, the remaining metal lines 212(1), 212(2), 212(5), and 212(6) can be electrically coupled to one or more of the gates 214(1)-214(4) so as to interconnect corresponding active devices.

With continuing reference to FIGS. 2A-2C, other aspects of the standard cell circuit 202 may employ a different ratio of metal pitch MP to gate pitch GP and achieve similar results. As a non-limiting example, the metal pitch MP can be between approximately one-half (½) and three-fourths (¾) of the gate pitch GP. If the metal pitch MP to gate pitch GP ratio is in such an exemplary range, the metal pitch MP may be between approximately twenty (20) nm and thirty (30) nm, while the gate pitch GP may be between approximately forty (40) nm and forty-two (42) nm, for example.

Further, as described above, employing the first and second voltage rails 204, 206 having the line width $W_{LINE}$ allows the cell height $H_{CELL}$ of the layout 200 of the standard cell circuit 202 to be less than the cell height $H_{CELL}$ of the layout 100 of the standard cell circuit 102 in FIG. 1. In particular, the cell height $H_{CELL}$ can be minimized by setting the line width $W_{LINE}$ approximately equal to a minimum line width of the process technology used to fabricate the standard cell circuit 202. As used herein, the minimum line width is the minimum size in which a routing line 224(1)-224(5) can be fabricated without violating design rules of the process technology. For example, a process technology having a ten (10) nm technology node size may have a minimum line width approximately equal to fourteen (14) nm. Minimizing the cell height $H_{CELL}$ allows the standard cell circuit 202 to achieve a reduced area compared to the standard cell circuit 102 in FIG. 1. Thus, the standard cell circuit 202 can achieve a smaller area compared to the standard cell circuit 102 in FIG. 1 by way of the narrower first and second voltage rails 204, 206, while also reducing or avoiding increases in voltage drop (i.e., IR drop) corresponding to the narrower first and second voltage rails 204, 206.

Figure 3:
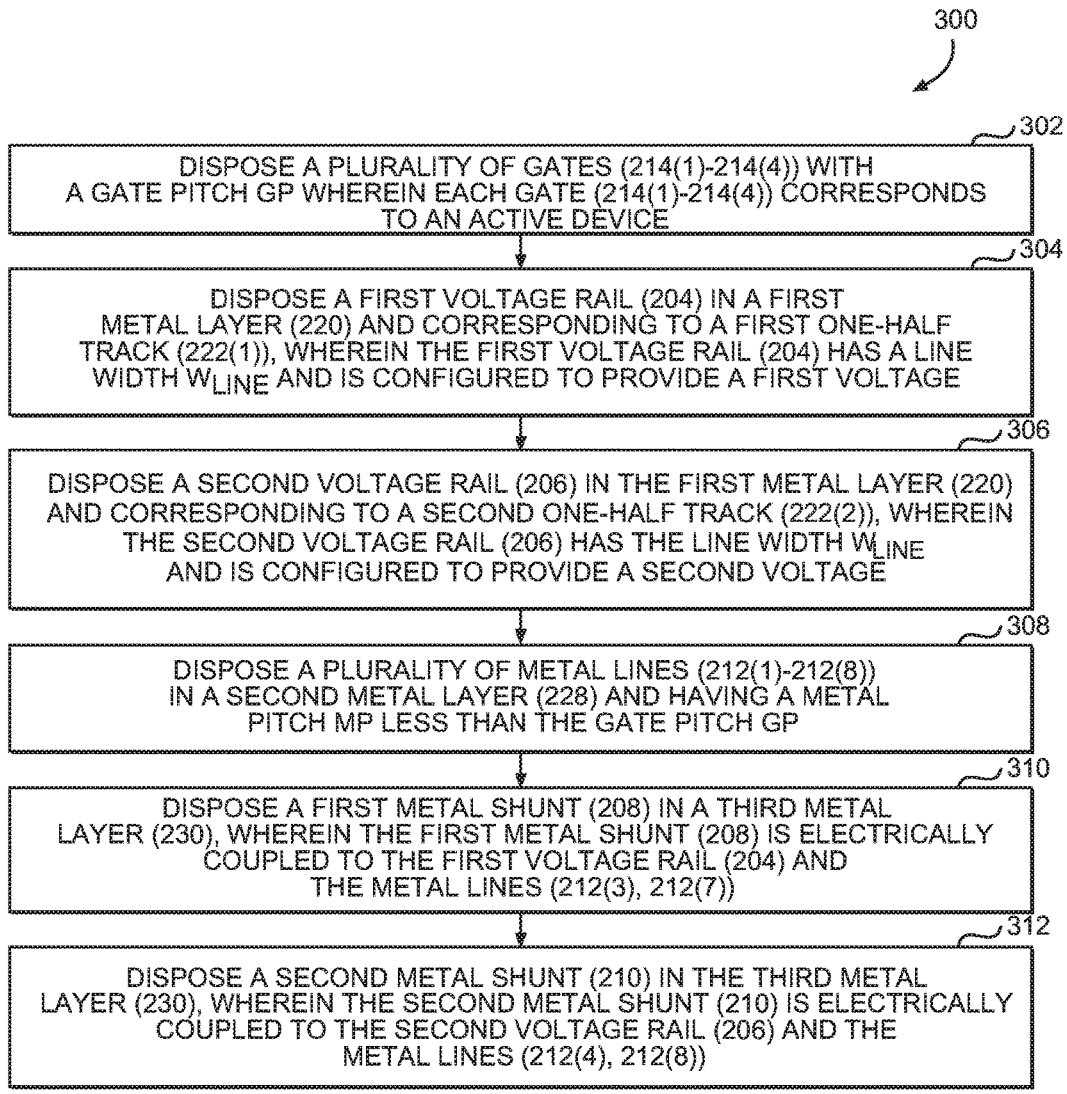
FIG. 3 is a flowchart illustrating an exemplary process for fabricating the standard cell circuit in FIG. 2A employing voltage rails electrically coupled to metal shunts by way of dedicated metal lines made available by employing a metal pitch that is less than a gate pitch, wherein the metal shunts reduce or avoid increases in voltage drop that would otherwise result from narrower voltage rails while allowing the standard cell circuit to achieve a reduced area.

FIG. 3 illustrates an exemplary process 300 for fabricating the standard cell circuit 202 in FIG. 2A. In this regard, the process 300 includes disposing the gates 214(1)-214(4) with the gate pitch GP (block 302). As previously noted, each gate 214(1)-214(4) corresponds to an active device. The process 300 also includes disposing the first voltage rail 204 in the first metal layer 220 (e.g., M0 metal layer) (block 304). As discussed above, the first voltage rail 204 corresponds to the first one-half track 222(1), has the line width $W_{LINE}$, and is configured to receive the first voltage. Additionally, the process 300 includes disposing the second voltage rail 206 in the first metal layer 220 (e.g., M0 metal layer) (block 306). As discussed above, the second voltage rail 206 corresponds to the second one-half track 222(2), has the line width $W_{LINE}$, and is configured to receive the second voltage. Although illustrated in separate blocks 304 and 306, the first and second voltage rails 204, 206 may be disposed concurrently or simultaneously during the fabrication process 300. Additionally, although not illustrated in FIG. 3, aspects disclosed herein may also dispose the routing lines 224(1)-224(5) concurrently or simultaneously with the first and second voltage rails 204, 206, if applicable.

With continuing reference to FIG. 3, the process 300 includes disposing the metal lines 212(1)-212(8) in the second metal layer 228 (e.g., M1 metal layer) and having the metal pitch MP less than the gate pitch GP (block 308). The process 300 also includes disposing the first metal shunt 208 in the third metal layer 230 (e.g., M2 metal layer), wherein the first metal shunt 208 is electrically coupled to the first voltage rail 204 and the metal lines 212(3), 212(7), which are not electrically coupled to the gates 214(1)-214(4) (block 310). For example, such electrical coupling can be achieved by disposing the first vias 232(1), 232(2) between the first and second metal layers 220, 228, and disposing the first vias 234(1), 234(2) between the second and third metal layers 228, 230, as previously described. Additionally, the process 300 includes disposing the second metal shunt 210 in the third metal layer 230 (e.g., M2 metal layer), wherein the second metal shunt 210 is electrically coupled to the second voltage rail 206 and the metal lines 212(4), 212(8), which are not electrically coupled to the gates 214(1)-214(4) (block 312). For example, such electrical coupling can be achieved by disposing the second vias 240(1), 240(2) between the first and second metal layers 220, 228, and disposing the second vias 242(1), 242(2) between the second and third metal layers 228, 230, as previously described. Additionally, although illustrated in separate blocks 310 and 312, the first and second metal shunts 208, 210 may be disposed concurrently or simultaneously during the fabrication process 300.

With continuing reference to FIG. 3, in the standard cell circuit 202 in FIGS. 2A-2C and fabricated using the process 300, the second metal layer 228 (e.g., M1 metal layer) is disposed above the first metal layer 220 (e.g., M0 metal layer). The third metal layer 230 (e.g., M2 metal layer) is disposed above the second metal layer 228 (e.g., M1 metal layer). However, other aspects may employ the first, second, and third metal layers 220, 228, and 230 in alternative orientations relative to one another and achieve similar results. In other words, the first, second, and third metal layers 220, 228, and 230 are not limited to the M0, M1, and M2 metal layers, respectively.

In addition to reducing or avoiding increases in voltage drop as described above, a standard cell circuit employing voltage rails electrically coupled to metal shunts may also achieve a higher power net (PN) vertical connection density as compared to conventional standard cell circuits. A higher PN vertical connection density can be used to adjust the resistance corresponding to the voltage rails of the standard cell circuit to achieve a desired voltage drop (i.e., IR drop) independent of the width of the standard cell circuit.

Figure 4:
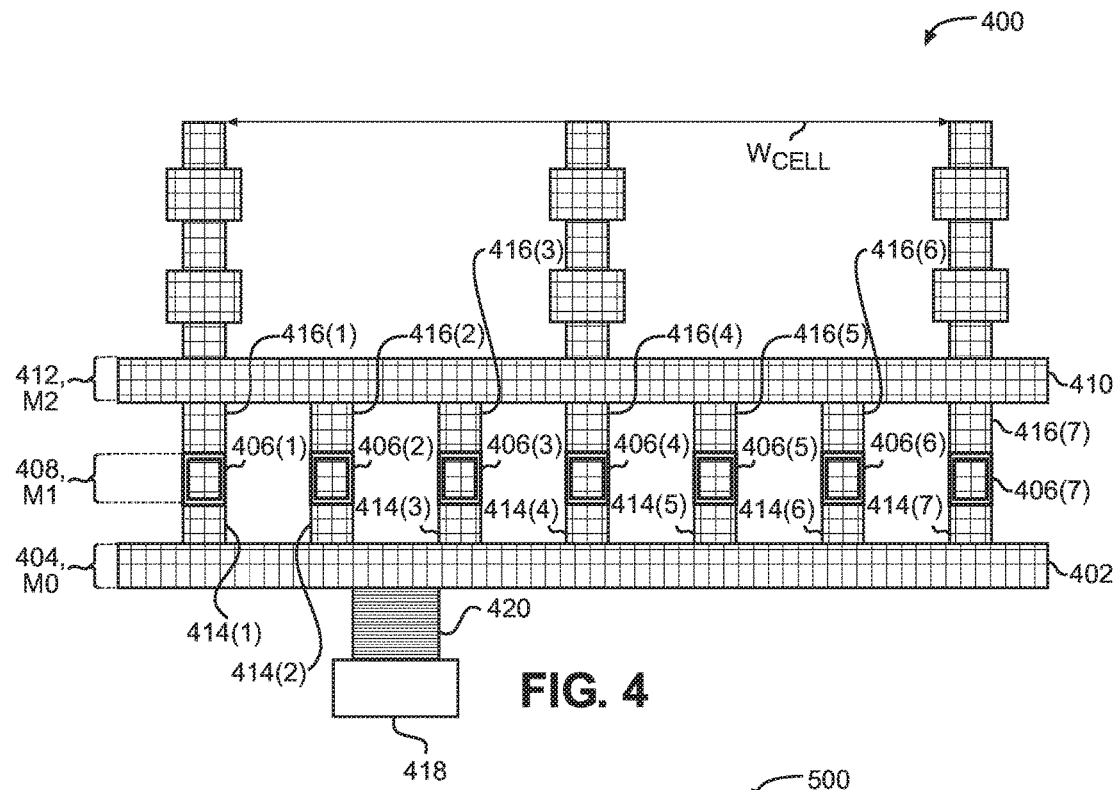
FIG. 4 is a cross-sectional diagram of an exemplary standard cell circuit employing voltage rails electrically coupled to respective metal shunts so as to achieve an increased power net (PN) vertical connection density.

In this regard, FIG. 4 illustrates a cross-sectional diagram of an exemplary standard cell circuit 400 designed to achieve an increased PN vertical connection density. More specifically, the standard cell circuit 400 includes a first voltage rail 402 disposed in a first metal layer 404 (e.g., a M0 metal layer). Metal lines 406(1)-406(7) are disposed in a second metal layer 408 (e.g., a M1 metal layer) that electrically couple to the first voltage rail 402 and a first metal shunt 410 disposed in a third metal layer 412 (e.g., a M2 metal layer). In this example, first vias 414(1)-414(7) are disposed between the first voltage rail 402 and a corresponding metal line 406(1)-406(7) such that the first vias 414(1)-414(7) electrically couple the metal lines 406(1)-406(7), respectively, to the first voltage rail 402. Additionally, first vias 416(1)-416(7) are disposed between the corresponding metal lines 406(1)-406(7) and the first metal shunt 410 such that the first vias 416(1)-416(7) electrically couple the metal lines 406(1)-406(7), respectively, to the first metal shunt 410. The first voltage rail 402 is electrically coupled to a device 418 using a contact 420.

With continuing reference to FIG. 4, the metal lines 406(1)-406(7) can be adjusted to change the resistance of the first voltage rail 402. For example, the number of metal lines 406(1)-406(7) may be reduced to achieve a higher resistance, and thus a higher voltage drop (i.e., IR drop). Alternatively, the number of metal lines 406(1)-406(7) may be left unchanged to achieve a lower resistance, and thus a lower voltage drop (i.e., IR drop). Importantly, adjusting the PN vertical connection density by adjusting the number of metal lines 406(1)-406(7) in this manner is independent of a cell width $H_{CELL}$ of the standard cell circuit 400. In other words, the PN vertical connection density, and thus the voltage drop (i.e., IR drop) of the standard cell circuit 400, can be adjusted as described above so as to provide a desired voltage to the device 418 without altering or being limited by the cell width $W_{CELL}$.

Figure 5:
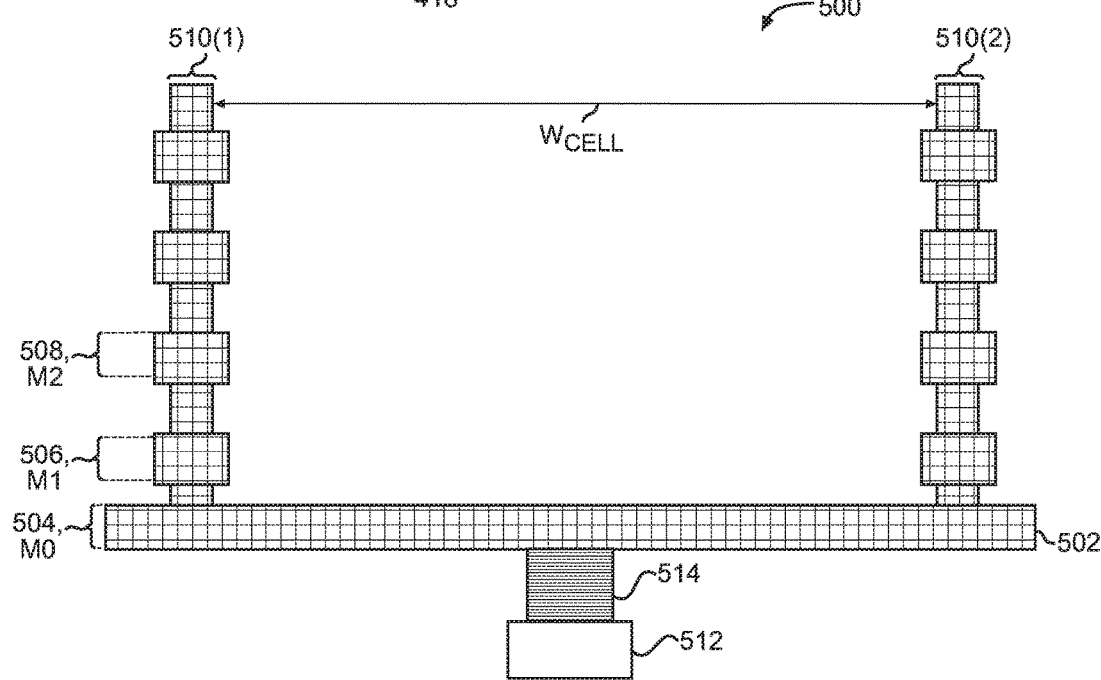
FIG. 5 is a cross-sectional diagram of a conventional standard cell circuit with a PN vertical connection density limited by the cell width of the conventional standard cell circuit.

In contrast, FIG. 5 illustrates a cross-sectional diagram of a conventional standard cell circuit 500 with a PN vertical connection density limited by the cell width $W_{CELL}$ of the standard cell circuit 500. More specifically, the standard cell circuit 500 includes a first voltage rail 502 disposed in a first metal layer 504 (e.g., a M0 metal layer). However, the standard cell circuit 500 does not include metal lines in a second metal layer 506 (e.g., a M1 metal layer) or a first metal shunt in a third metal layer 508 (e.g., a M2 metal layer) as in the standard cell circuit 400 in FIG. 4. In this manner, the PN vertical connection density of the standard cell circuit 500 is limited to a first vertical leg 510(1) and a second vertical leg 510(2) at the outer boundary edges of the standard cell circuit 500. In other words, because the standard cell circuit 500 only includes connections to the first voltage rail 502 at the outer boundary edges, the PN vertical connection density is dependent on the cell width $W_{CELL}$ of the standard cell circuit 500. Thus, the voltage provided to a device 512 electrically coupled to the first voltage rail 502 using a contact 514 is also dependent on the cell width $W_{CELL}$.

The elements described herein are sometimes referred to as means for performing particular functions. In this regard, the active devices are sometimes referred to herein as "a means for performing a logic function," and the gates 214(1)-214(4) are sometimes referred to herein as "a means for receiving gate voltage disposed in a first direction with a gate pitch." The first voltage rail 204 is sometimes referred to herein as "a means for providing a first voltage disposed in a first metal layer having a line width and corresponding to a first one-half track." The second voltage rail 206 is sometimes referred to herein as "a means for providing a second voltage disposed in the first metal layer having the line width and corresponding to a second one-half track." The metal lines 212(1)-212(8) are sometimes referred to herein as "a plurality of means for electrically coupling disposed in a second metal layer with a metal pitch less than the gate pitch."

Additionally, the first metal shunt 208 is sometimes referred to herein as "a means for increasing a first resistance disposed in a third metal layer electrically coupled to the means for providing the first voltage and one or more means for electrically coupling not electrically coupled to the means for receiving the gate voltage." The second metal shunt 210 is sometimes referred to herein as "a means for increasing a second resistance disposed in the third metal layer electrically coupled to the means for providing the second voltage and one or more means for electrically coupling not electrically coupled to the means for receiving the gate voltage." Further, the first vias 232(1), 232(2) are sometimes referred to herein as "a means for interconnecting the means for providing the first voltage to the plurality of means for electrically coupling." The second vias 240(1), 240(2) are sometimes referred to herein as "a means for interconnecting the means for providing the second voltage to the plurality of means for electrically coupling." The first vias 234(1), 234(2) are sometimes referred to herein as "a means for interconnecting the means for electrically coupling to the means for increasing the first resistance." Further, the second vias 242(1), 242(2) are sometimes referred to herein as "a means for interconnecting the means for electrically coupling to the plurality of means for increasing the second resistance."

The standard cell circuits employing voltage rails electrically coupled to metal shunts for reducing or avoiding increases in voltage drop according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
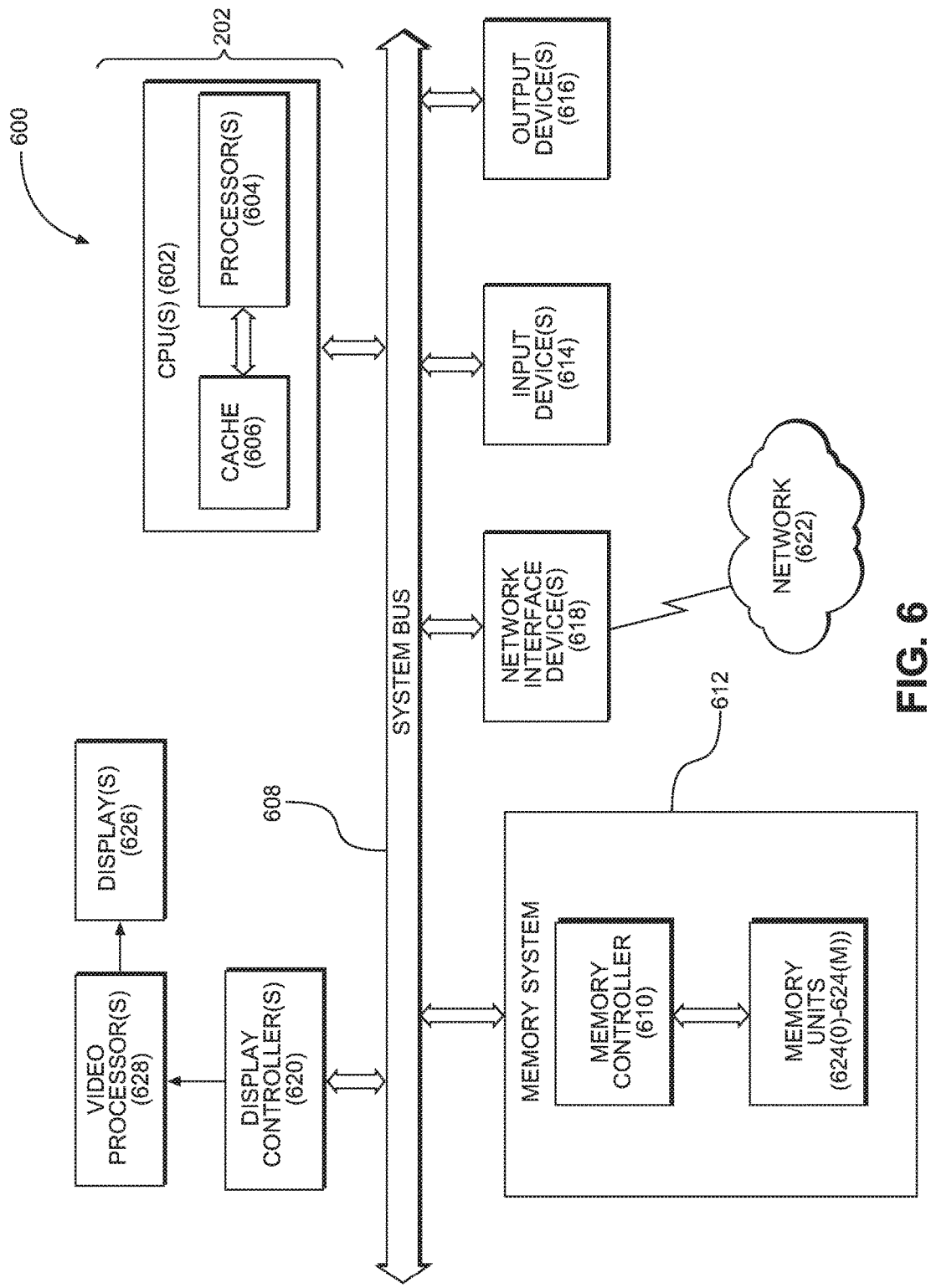
FIG. 6 is a block diagram of an exemplary processor-based system that can include the standard cell circuit employing voltage rails electrically coupled to metal shunts for reducing or avoiding increases in voltage drop while achieving a reduced area of FIG. 2A.

In this regard, FIG. 6 illustrates an example of a processor-based system 600 that can employ the standard cell circuit 202 employing voltage rails electrically coupled to metal shunts for reducing or avoiding increases in voltage drop while achieving a reduced area illustrated in FIG. 2A. In this example, the processor-based system 600 includes one or more central processing units (CPUs) 602, each including one or more processors 604. The CPU(s) 602 may have cache memory 606 coupled to the processor(s) 604 for rapid access to temporarily stored data. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated in FIG. 6, multiple system buses 608 could be provided, wherein each system bus 608 constitutes a different fabric.

Other master and slave devices can be connected to the system bus 608. As illustrated in FIG. 6, these devices can include a memory system 612, one or more input devices 614, one or more output devices 616, one or more network interface devices 618, and one or more display controllers 620, as examples. The input device(s) 614 can include any type of input device, including, but not limited to, input keys, switches, voice processors, etc. The output device(s) 616 can include any type of output device, including, but not limited to, audio, video, other visual indicators, etc. The network interface device(s) 618 can be any device configured to allow exchange of data to and from a network 622. The network 622 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 618 can be configured to support any type of communications protocol desired. The memory system 612 can include one or more memory units 624(0)-624(M).

The CPU(s) 602 may also be configured to access the display controller(s) 620 over the system bus 608 to control information sent to one or more displays 626. The display controller(s) 620 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, a light emitting diode (LED) display, etc.

Figure 7:
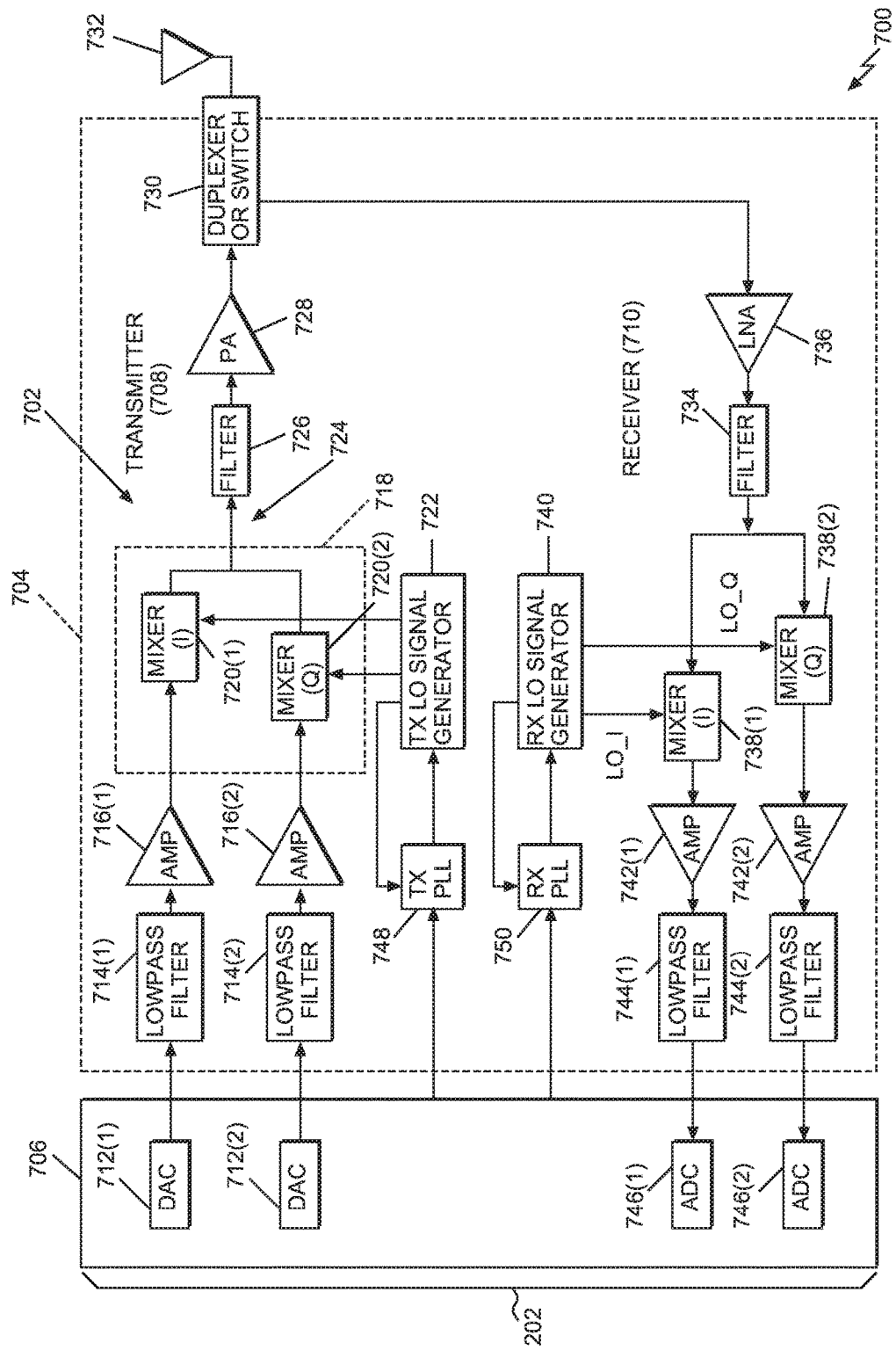
FIG. 7 is a block diagram of an exemplary wireless communications device that includes radio-frequency (RF) components formed in an integrated circuit (IC), wherein the RF components can include the standard cell circuit employing voltage rails electrically coupled to metal shunts for reducing or avoiding increases in voltage drop while achieving a reduced area of FIG. 2A.

FIG. 7 illustrates an example of a wireless communications device 700 that can include the standard cell circuit 202 employing voltage rails electrically coupled to metal shunts for reducing or avoiding increases in voltage drop while achieving a reduced area illustrated in FIG. 2A. In this regard, the wireless communications device 700 may be provided in an integrated circuit (IC) 702. The wireless communications device 700 may include or be provided in any of the above referenced devices, as examples. As shown in FIG. 7, the wireless communications device 700 includes a transceiver 704 and a data processor 706. The data processor 706 may include a memory (not shown) to store data and program codes. The transceiver 704 includes a transmitter 708 and a receiver 710 that support bi-directional communication. In general, the wireless communications device 700 may include any number of transmitters and/or receivers for any number of communication systems and frequency bands. All or a portion of the transceiver 704 may be implemented on one or more analog ICs, RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the wireless communications device 700 in FIG. 7, the transmitter 708 and the receiver 710 are implemented with the direct-conversion architecture.

In the transmit path, the data processor 706 processes data to be transmitted and provides I and Q analog output signals to the transmitter 708. In the exemplary wireless communications device 700, the data processor 706 includes digital-to-analog-converters (DACs) 712(1), 712(2) for converting digital signals generated by the data processor 706 into the I and Q analog output signals, e.g., I and Q output currents, for further processing.

Within the transmitter 708, lowpass filters 714(1), 714(2) filter the I and Q analog output signals, respectively, to remove undesired signals caused by the prior digital-to-analog conversion. Amplifiers (AMP) 716(1), 716(2) amplify the signals from the lowpass filters 714(1), 714(2), respectively, and provide I and Q baseband signals. An upconverter 718 upconverts the I and Q baseband signals with I and Q transmit (TX) local oscillator (LO) signals through mixers 720(1), 720(2) from a TX LO signal generator 722 to provide an upconverted signal 724. A filter 726 filters the upconverted signal 724 to remove undesired signals caused by the frequency upconversion as well as noise in a receive frequency band. A power amplifier (PA) 728 amplifies the upconverted signal 724 from the filter 726 to obtain the desired output power level and provides a transmit RF signal. The transmit RF signal is routed through a duplexer or switch 730 and transmitted via an antenna 732.

In the receive path, the antenna 732 receives signals transmitted by base stations and provides a received RF signal, which is routed through the duplexer or switch 730 and provided to a low noise amplifier (LNA) 734. The duplexer or switch 730 is designed to operate with a specific RX-to-TX duplexer frequency separation, such that RX signals are isolated from TX signals. The received RF signal is amplified by the LNA 734 and filtered by a filter 736 to obtain a desired RF input signal. Downconversion mixers 738(1), 738(2) mix the output of the filter 736 with I and Q receive (RX) LO signals (i.e., LO_I and LO_Q) from an RX LO signal generator 740 to generate I and Q baseband signals. The I and Q baseband signals are amplified by amplifiers (AMP) 742(1), 742(2) and further filtered by lowpass filters 744(1), 744(2) to obtain I and Q analog input signals, which are provided to the data processor 706. In this example, the data processor 706 includes analog-to-digital-converters (ADCs) 746(1), 746(2) for converting the analog input signals into digital signals to be further processed by the data processor 706.

In the wireless communications device 700 in FIG. 7, the TX LO signal generator 722 generates the I and Q TX LO signals used for frequency upconversion, while the RX LO signal generator 740 generates the I and Q RX LO signals used for frequency downconversion. Each LO signal is a periodic signal with a particular fundamental frequency. A transmit (TX) phase-locked loop (PLL) circuit 748 receives timing information from the data processor 706 and generates a control signal used to adjust the frequency and/or phase of the TX LO signals from the TX LO signal generator 722. Similarly, a receive (RX) phase-locked loop (PLL) circuit 750 receives timing information from the data processor 706 and generates a control signal used to adjust the frequency and/or phase of the RX LO signals from the RX LO signal generator 740.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined and/or performed concurrently or simultaneously. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A standard cell circuit, comprising:
a plurality of active devices comprising a plurality of corresponding gates disposed with a gate pitch;
a first voltage rail having a line width disposed in a first metal layer and corresponding to a first one-half track, wherein the first voltage rail is configured to receive a first voltage;
a second voltage rail having the line width disposed in the first metal layer and corresponding to a second one-half track, wherein the second voltage rail is configured to receive a second voltage;
a plurality of metal lines disposed in a second metal layer with a metal pitch less than the gate pitch, wherein one or more metal lines of the plurality of metal lines is electrically coupled to one or more gates of the plurality of gates;
a first metal shunt disposed in a third metal layer and electrically coupled to the first voltage rail and one or more metal lines of the plurality of metal lines not electrically coupled to the one or more gates;
a second metal shunt disposed in the third metal layer and electrically coupled to the second voltage rail and one or more metal lines of the plurality of metal lines not electrically coupled to the one or more gates; and
a plurality of routing lines disposed in the first metal layer between the first voltage rail and the second voltage rail, wherein each routing line has substantially a same line width as the first voltage rail and the second voltage rail, and each routing line corresponds to a routing track of a plurality of routing tracks.

2. The standard cell circuit of claim 1, further comprising:
one or more first vias disposed between the first metal layer and the second metal layer, wherein each of the one or more first vias electrically couples the first voltage rail to one or more corresponding metal lines; and
one or more second vias disposed between the first metal layer and the second metal layer, wherein each of the one or more second vias electrically couples the second voltage rail to one or more corresponding metal lines.

3. The standard cell circuit of claim 2, further comprising:
one or more first vias disposed between the second metal layer and the third metal layer, wherein each of the one or more first vias electrically couples one or more corresponding metal lines to the first metal shunt; and
one or more second vias disposed between the second metal layer and the third metal layer, wherein each of the one or more second vias electrically couples one or more corresponding metal lines to the second metal shunt.

4. The standard cell circuit of claim 1, wherein the metal pitch is approximately equal to two-thirds (⅔) of the gate pitch.

5. The standard cell circuit of claim 4, wherein:
the metal pitch is approximately equal to twenty-eight (28) nanometers (nm); and
the gate pitch is approximately equal to forty-two (42) nm.

6. The standard cell circuit of claim 1, wherein the metal pitch is between approximately one-half (½) and three-fourths (¾) of the gate pitch.

7. The standard cell circuit of claim 6, wherein:
the metal pitch is between approximately twenty (20) nm and thirty (30) nm; and
the gate pitch is between approximately forty (40) nm and forty-two (42) nm.

8. The standard cell circuit of claim 1, wherein the plurality of routing tracks comprises four (4) tracks.

9. The standard cell circuit of claim 1, wherein:
the second metal layer is disposed between the first metal layer and the third metal layer; and
the third metal layer is disposed above the second metal layer.

10. The standard cell circuit of claim 9, wherein the first metal layer comprises a metal zero (M0) metal layer.

11. The standard cell circuit of claim 10, wherein the second metal layer comprises a metal one (M1) metal layer.

12. The standard cell circuit of claim 11, wherein the third metal layer comprises a metal two (M2) metal layer.

13. The standard cell circuit of claim 1, wherein the line width is approximately equal to a minimum line width.

14. The standard cell circuit of claim 1, further comprising a technology node size equal to approximately ten (10) nanometers (nm).

15. The standard cell circuit of claim 1 integrated into an integrated circuit (IC).

16. The standard cell circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A standard cell circuit, comprising:
a means for performing a logic function comprising a means for receiving a gate voltage disposed with a gate pitch;
a means for providing a first voltage disposed in a first metal layer having a line width and corresponding to a first one-half track;
a means for providing a second voltage disposed in the first metal layer having the line width and corresponding to a second one-half track;
a plurality of means for electrically coupling disposed in a second metal layer with a metal pitch less than the gate pitch, wherein one or more means for electrically coupling is electrically coupled to the means for receiving the gate voltage;
a means for increasing a first resistance disposed in a third metal layer electrically coupled to the means for providing the first voltage and one or more means for electrically coupling not electrically coupled to the means for receiving the gate voltage;
a means for increasing a second resistance disposed in the third metal layer electrically coupled to the means for providing the second voltage and one or more means for electrically coupling not electrically coupled to the means for receiving the gate voltage; and
a plurality of means for routing disposed in the first metal layer between the means for providing the first voltage and the means for providing the second voltage, wherein each of the means for routing has substantially a same line width as the means for providing the first voltage and the means for providing the second voltage, and each of the means for routing corresponds to a routing track of a plurality of routing tracks.

18. The standard cell circuit of claim 17, further comprising:
a means for interconnecting the means for providing the first voltage to the one or more means for electrically coupling; and
a means for interconnecting the means for providing the second voltage to the one or more means for electrically coupling.

19. The standard cell circuit of claim 18, further comprising:
a means for interconnecting the one or more means for electrically coupling to the means for increasing the first resistance; and
a means for interconnecting the one or more means for electrically coupling to the means for increasing the second resistance.

20. The standard cell circuit of claim 17, wherein the metal pitch is approximately equal to two-thirds of the gate pitch.

21. The standard cell circuit of claim 17, wherein:
the second metal layer is disposed between the first metal layer and the third metal layer; and
the third metal layer is disposed above the second metal layer.

22. A method of manufacturing a standard cell circuit employing voltage rails electrically coupled to metal shunts for reducing or avoiding increases in voltage drop, comprising:
disposing a plurality of gates with a gate pitch, wherein each gate of the plurality of gates corresponds to an active device of a plurality of active devices;
disposing a first voltage rail in a first metal layer and corresponding to a first one-half track, wherein the first voltage rail has a line width and is configured to receive a first voltage;
disposing a second voltage rail in the first metal layer and corresponding to a second one-half track, wherein the second voltage rail has the line width and is configured to receive a second voltage;
disposing a plurality of metal lines in a second metal layer and having a metal pitch less than the gate pitch, wherein one or more metal lines of the plurality of metal lines is electrically coupled to one or more gates of the plurality of gates;
disposing a first metal shunt in a third metal layer, wherein the first metal shunt is electrically coupled to the first voltage rail and one or more metal lines of the plurality of metal lines not electrically coupled to the one or more gates; and
disposing a second metal shunt in the third metal layer, wherein the second metal shunt is electrically coupled to the second voltage rail and one or more metal lines of the plurality of metal lines not electrically coupled to the one or more gates;
wherein the second metal layer is disposed between the first metal layer and the third metal layer, and the third metal layer is disposed above the second metal layer.

23. The method of claim 22, further comprising:
disposing one or more first vias between the first metal layer and the second metal layer, wherein each of the one or more first vias electrically couples the first voltage rail to one or more corresponding metal lines; and
disposing one or more second vias between the first metal layer and the second metal layer, wherein each of the one or more second vias electrically couples the second voltage rail to one or more corresponding metal lines.

24. The method of claim 23, further comprising:
disposing one or more first vias between the second metal layer and the third metal layer, wherein each of the one or more first vias electrically couples one or more corresponding metal lines to the first metal shunt; and
disposing one or more second vias between the second metal layer and the third metal layer, wherein each of the one or more second vias electrically couples one or more corresponding metal lines to the second metal shunt.

25. The method of claim 22, wherein disposing the plurality of metal lines comprises disposing the plurality of metal lines having the metal pitch approximately equal to two-thirds of the gate pitch.

26. The method of claim 22, wherein disposing the plurality of metal lines comprises disposing the plurality of metal lines having the metal pitch between approximately one-half (½) and three-fourths (¾) of the gate pitch.

* * * * *